(12) United States Patent
Hara

(10) Patent No.: US 7,534,687 B2
(45) Date of Patent: May 19, 2009

(54) SEMICONDUCTOR DEVICE AND METHOD FOR MANUFACTURING THE SAME

(75) Inventor: Toshiki Hara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 217 days.

(21) Appl. No.: 11/486,555

(22) Filed: Jul. 13, 2006

(65) Prior Publication Data

US 2007/0013005 A1 Jan. 18, 2007

(30) Foreign Application Priority Data

Jul. 13, 2005 (JP) .............................. 2005-203918

(51) Int. Cl.
H01L 21/84 (2006.01)

(52) U.S. Cl. ....................... 438/285; 438/294; 438/296; 438/421; 438/424; 438/738; 257/E21.546; 257/E21.564; 257/E21.573; 257/E27.085; 257/E27.097; 257/E27.112; 257/E29.284; 257/E29.286; 257/E29.295

(58) Field of Classification Search ................. 438/158, 438/285, 294, 296, 421, 424, 738; 257/E21, 257/546, 564, 573, E27.082, 97, 112, E29.284, 257/286, 295

See application file for complete search history.

(56) References Cited

U.S. PATENT DOCUMENTS

| | | | | |
|---|---|---|---|---|
| 6,630,714 | B2 * | 10/2003 | Sato et al. | 257/350 |
| 6,677,209 | B2 * | 1/2004 | Farrar | 438/296 |
| 6,713,356 | B1 * | 3/2004 | Skotnicki et al. | 438/285 |
| 7,019,364 | B1 * | 3/2006 | Sato et al. | 257/E27.097 |
| 2005/0098094 | A1 * | 5/2005 | Oh et al. | 117/95 |
| 2006/0208342 | A1 * | 9/2006 | Choi et al. | 257/618 |

FOREIGN PATENT DOCUMENTS

| | | |
|---|---|---|
| JP | 2003-332540 | 11/2003 |
| WO | WO-00/57480 | 9/2000 |

* cited by examiner

*Primary Examiner*—Michael S Lebentritt
(74) *Attorney, Agent, or Firm*—John J. Penny, Jr.; Catherine J. Toppin; Edwards Angell Palmer & Dodge LLP

(57) ABSTRACT

A semiconductor device, comprises: a transistor having structured to include a gate electrode formed on a semiconductor layer on a semiconductor substrate via a gate insulating film, and a source layer and a drain layer formed on the semiconductor layer sandwiching the gate electrode; a hollow portion existing between the source layer and the semiconductor substrate, and between the drain layer and the semiconductor substrate, respectively; and the hollow portion in absence between the semiconductor layer under the gate electrode and the semiconductor substrate.

5 Claims, 3 Drawing Sheets

SEMICONDUCTOR DEVICE AND METHOD FOR MANUFACTURING THE SAME

BACKGROUND OF THE INVENTION

1. Technical Field

The present invention relates to a semiconductor device and a method for manufacturing the same, more particularly, which is capable of reducing a self-heat generation effect and suppress a substrate floating effect.

2. Related Art

A field effect transistor which is formed on a silicon-on-insulator (SOI) substrate (hereinafter to be called an 'SOI transistor') is brought to attention for its utilities, in terms of easy device isolation, latch-up free, low source/drain junction capacitance, and the like. In particular, as a fully depleted SOI transistor is capable of operating at high speed with low power consumption and is easily driven by low voltage, research for operating the SOI transistor in a fully depleted mode has become increasingly popular.

Normally, an insulator of the SOI corresponds to silicon oxide ($SiO_2$). A dielectric constant of silicon oxide is 3.9, which is small enough compared to the dielectric constant of silicon which is 11.9. However, an ultimate dielectric constant material is air. Therefore, a transistor which has air as an insulating layer, more particularly, a silicon-on-nothing (SON) transistor has started to gain attention.

A method for manufacturing an SON structure, for example, is disclosed in JP-A-2003-332540. More specifically, the JP-A-2003-332540 discloses a method for manufacturing a semiconductor substrate including a first step of implanting ions to form a microcavity in a desired region of a substrate, a second step of heat-treating the substrate that the microcavity was formed by the first step, and the second step of having at least a step of high temperature heat treatment which exposes the substrate to temperature exceeding 1000 degrees Celsius. In such a manufacturing method, by growing and uniting the microcavities formed on the substrate, an SON semiconductor substrate having a flat cavity roughly-paralleled to a substrate surface can be formed.

However, compared to silicon oxide and silicon, air has bad thermal conductivity. Therefore, operating temperature of an SON device (in other words, a device having the SON transistor) becomes higher compared to a conventional silicon device and an SOI device. A phenomenon which is called the self-heat generation effect deteriorates performance and reliability of the device (problem 1).

Further, in the SOI device, there is also a problem of the substrate floating effect which is caused by a body potential of the SOI transistor being in a floating state by complete device isolation. Consequences of the effect include, for example in an Nch transistor, a generation of a hole at the end of a drain by impact ionization, and because the hole is to be accumulated in the body, thereby results in a degradation of a break-down voltage and the like (problem 2).

SUMMARY

An advantage of the present invention is to solve the above problems and provides a semiconductor device and a method for manufacturing the same, which can reduce a self-heat generation effect and suppress a substrate floating effect.

In order to accomplish the above purpose, a semiconductor device of first aspect of the invention includes: a transistor having structured to include a gate electrode formed on a semiconductor layer on a semiconductor substrate via a gate insulating film, and a source layer and a drain layer formed on the semiconductor layer sandwiching the gate electrode; a hollow portion existing between the source layer and the semiconductor substrate, and between the drain layer and the semiconductor substrate, respectively; and the hollow portion not existing between the semiconductor layer under the gate electrode and the semiconductor substrate.

The 'semiconductor substrate' in this case, for example, is a bulk silicon (Si) substrate and the 'semiconductor layer', for example, is a Si layer formed by an epitaxial growth method.

According to the semiconductor device of the fist aspect of the invention, only the source layer and the drain layer have an SON structure, and the semiconductor layer under the gate electrode has a structure that is connected to the semiconductor substrate (this structure is to be called SDON: Source/Drain On Nothing). Accordingly, compared to the SON transistor, it can reduce the self-heat generation effect. Also, a potential of the semiconductor layer under the gate electrode (in other words, a body potential) is to be fixed to the semiconductor substrate, thereby enabling to suppress the substrate floating effect.

A semiconductor device of a second aspect of the invention, in accordance with the semiconductor device of the first aspect of the invention, wherein the semiconductor layer, which the source layer and the drain layer are formed, has a large thickness and a surface placed above the surface of the semiconductor layer under the gate electrode. The '(semiconductor layer) has a large thickness' in this case means, that the thickness of the aforementioned semiconductor layer is thick in the rage that during a plug electrode and the like are to be formed on the source layer and the drain layer, the plug electrode does not at least penetrate the semiconductor layer and reach the hollow portion underneath.

According to the semiconductor device of the second aspect of the invention, the problem such as the plug electrode and the like, which contact the source layer and the drain layer, reaching to the hollow portion can be prevented.

A method for manufacturing a semiconductor device of a third aspect of the invention includes: (a) forming a first semiconductor layer on the semiconductor substrate in a transistor forming region; (b) forming a groove portion in the first semiconductor layer so as to expose the surface of the semiconductor substrate by etching and removing a portion sandwiched between a source forming region and a drain forming region of the aforementioned first semiconductor layer; (c) forming a second semiconductor layer having a smaller etching selectivity than the first semiconductor layer on the semiconductor substrate in the transistor forming region, so as an inside of the groove portion is to be embedded and the first semiconductor layer is to be coated thereon; (d) forming the hollow portion under the second semiconductor layer by etching and removing the first semiconductor layer under the second semiconductor layer from an outside of the transistor forming region; and (e) blocking an aperture plane of the hollow portion with a predetermined member, leaving the aforementioned hollow portion under the second semiconductor layer.

The 'first semiconductor layer' in this case is a silicon germanium (SiGe) layer. Further, the 'second semiconductor layer', for example, is a Si layer. The first semiconductor layer and the second semiconductor layer such as these are formed, for example, by the epitaxial growth method.

According to the method for manufacturing the semiconductor device of the invention 3, only the source layer and the drain layer have the SON structure, thereby enabling to form a transistor with a structure that the second semiconductor layer under the gate electrode is connected to the semiconductor substrate (in other words, an SDON structure).

In the transistor with such a structure, the semiconductor layer under the gate electrode is connected to the semiconductor substrate, thereby enabling to reduce the self-heat generation effect compared to the SON transistor. Further, the potential of the second semiconductor layer under the gate electrode (in other words, the body potential) is to be fixed to the semiconductor substrate, thereby enabling to suppress the substrate floating effect.

A method for manufacturing a semiconductor device of a fourth aspect of the invention includes: (a) forming the first semiconductor layer on the semiconductor substrate; (b) forming the groove portion in the first semiconductor layer so as to expose the surface of the semiconductor substrate by etching and removing the portion sandwiched between the source forming region and the drain forming region of the aforementioned first semiconductor layer; (c) forming the second semiconductor layer having the smaller etching selectivity than the first semiconductor layer on the semiconductor substrate so as the inside of the groove portion is to be embedded and the first semiconductor layer is to be coated thereon; (d) exposing ends of the first semiconductor layer along a periphery of the transistor forming region, by sequentially etching and removing the second semiconductor layer outside of the transistor forming region and the first semiconductor layer outside of the aforementioned; (e) forming the hollow portion under the second semiconductor layer in the transistor forming region by etching and removing the first semiconductor layer from the exposed ends; and (f) blocking the aperture plane of the hollow portion with the predetermined member, leaving the aforementioned hollow portion under the second semiconductor layer.

Such a structure enables to form the transistor with the SDON structure (hereinafter may be referred to as an 'SDON transistor'). Therefore, compared to the SON transistor, it can reduce the self-heat generation effect. Further, the potential of the second semiconductor layer under the gate electrode (in other words, the body potential) is to be fixed to the semiconductor substrate, thereby enabling to suppress the substrate floating effect.

A method for manufacturing a semiconductor device of a fifth aspect of the invention includes: (a) forming the first semiconductor layer on the semiconductor substrate; (b) forming a semiconductor layer A having the smaller etching selectivity than the first semiconductor layer on the aforementioned first semiconductor layer; (c) forming the groove portion in a laminated body so as to expose the surface of the semiconductor substrate by etching and removing the portion sandwiched between the source forming region and the drain forming region of the aforementioned laminated body configured with the first semiconductor layer and the semiconductor layer A; (d) forming a semiconductor layer B being made of the same material as the semiconductor layer A on the semiconductor substrate so as the inside of the groove portion is to be embedded and the first semiconductor layer is to be coated thereon; (e) exposing the ends of the first semiconductor layer along the periphery of the transistor forming region by sequentially etching and removing the portion outside of the transistor forming region of the second semiconductor layer configured with the semiconductor layer A and the semiconductor layer B, and the first semiconductor layer outside of the aforementioned; (f) forming the hollow portion under the second semiconductor layer in the transistor forming region by etching and removing the first semiconductor layer from the exposed ends; and (g) blocking the aperture plane of the hollow portion with the predetermined member, leaving the hollow portion under the second semiconductor layer.

The 'semiconductor layer A' and the 'semiconductor layer B' in this case, for example, are the Si layer. The semiconductor layer A and the semiconductor layer B such as these, for example, are formed by the epitaxial growth method.

According to the method for manufacturing the semiconductor device of the fifth aspect of the invention, the SDON transistor can be formed, thereby enabling to reduce the self-heat generation effect compared to the SON transistor. Further, the potential of the second semiconductor layer under the gate electrode (in other words, the body potential) is to be fixed to the semiconductor substrate, thereby enabling to suppress the substrate floating effect.

Furthermore, according to the method for manufacturing the semiconductor device, only the second semiconductor layer of the source forming region and the drain forming region is thick, thereby enabling to form a structure that the surface is placed above the surface of the second semiconductor layer under the gate electrode (in other words, an elevated source/drain structure). For example, by forming the semiconductor layer A thick, it is possible to thicken only the second semiconductor layer of the source forming region and the drain forming region. Therefore, it enables to prevent the problem, such as, the plug electrode and the like which contact the source layer and the drain layer reaching to the hollow portion.

A method for manufacturing a semiconductor device of a sixth aspect of the invention, in accordance with any one of the method for manufacturing the semiconductor device from the inventions 3 through 5, includes: (a) forming the hollow portion under the second semiconductor layer in the transistor forming region; (b) forming the gate electrode on the second semiconductor layer sandwiched between the source forming region and the drain forming region via the gate insulating film, during the process of blocking the aperture plane of the hollow portion; and (c) forming the source layer on the second semiconductor layer in the source forming region, and forming the drain layer on the second semiconductor layer in the drain forming region.

In such a structure, the semiconductor device mounting the SDON transistor (in other words, an SDON device), which a parasitic capacitance of the source layer and the drain layer is ultimately reduced, can be provided.

A method for manufacturing a semiconductor device of a seventh aspect of the invention, in accordance with the method for manufacturing the semiconductor device of the sixth aspect of the invention, wherein the predetermined member is an inter-device isolation insulating film and the step of blocking the aperture plane of the hollow portion includes to form the inter-device isolation insulating film over the entire semiconductor substrate so as to block the aperture plane of the hollow portion, and leave the aforementioned hollow portion under the second semiconductor layer.

In such a structure, the process of blocking the aperture plane of the hollow portion and the process of forming an interlayer insulating film are to be performed simultaneously, thereby enabling to shorten the manufacturing process of the semiconductor device.

BRIEF DESCRIPTION OF THE DRAWINGS

The invention will be described with reference to the accompanying drawings, wherein like numbers reference like devices.

DESCRIPTION OF EXEMPLARY EMBODIMENTS

Embodiments of the invention will now be described below with reference to the drawings.

FIGS. 1A through 3B are cross sections illustrating a method for manufacturing a semiconductor device according to the present embodiment.

Figure 1A:
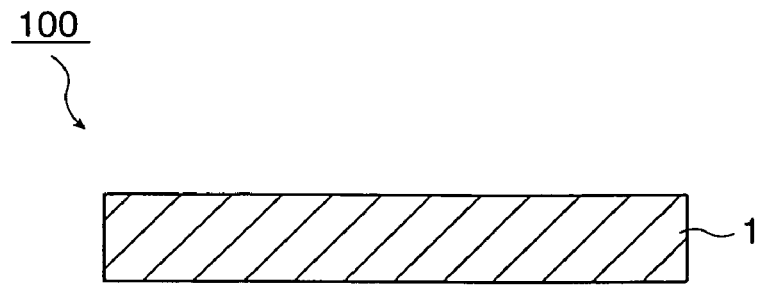
FIGS. 1A through 1C are diagrams illustrating a method for manufacturing a semiconductor device according to an embodiment.
Figure 1B:
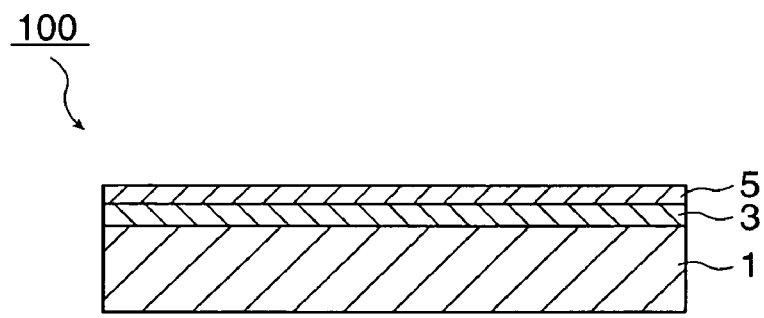

As shown in FIG. 1A, to begin with, a Si substrate 1, which is a bulk silicon wafer, is to be prepared. Next, as shown in FIG. 1B, a SiGe layer 3 is to be formed on the Si substrate 1, and then a first Si layer 5 is to be formed on the above. The SiGe layer 3 and the Si layer 5 are formed by an epitaxial growth method (or a selective epitaxial growth method), respectively.

Meanwhile, in the case that a dry etching process was carried out towards the Si substrate 1 before forming the SiGe layer 3, there is a possibility that damage may have occurred to the Si substrate 1 by the dry etching process. Therefore, in order to remove the damage, a surface of the Si substrate 1 may be thinly oxidized, followed by removing the oxide film by a wet etching, before forming the SiGe layer 3.

Figure 1C:
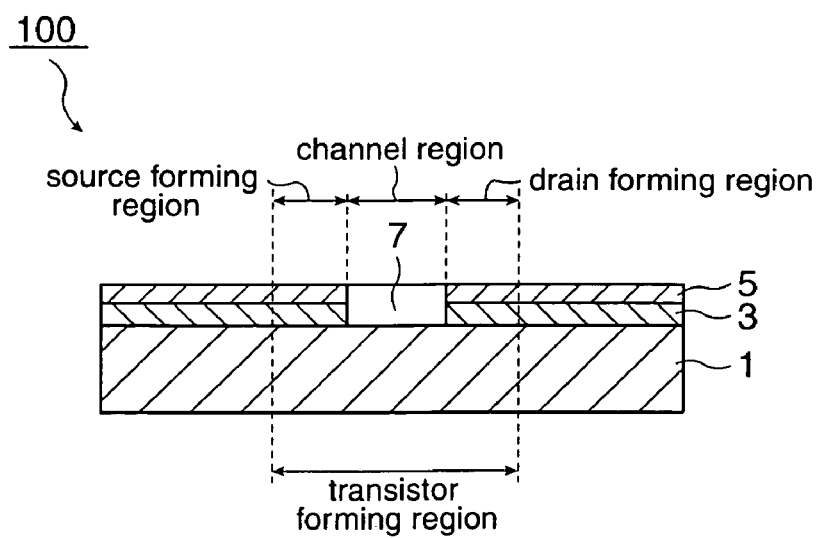

Next, as shown in FIG. 1C, by using a photolithography technology and an etching technique, a trench (groove portion) 7 is to be formed in a laminated body made of the SiGe layer 3 and the Si layer 5 so as to expose the surface of the Si substrate 1. The trench 7 is to be formed in an area sandwiched between a source forming region and a drain forming region in a transistor forming region (hereinafter to be called a 'channel region').

Figure 2A:
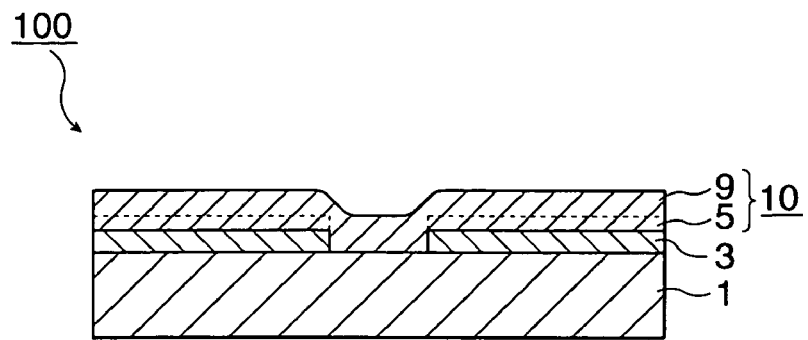
FIGS. 2A through 2C are diagrams illustrating the method for manufacturing the semiconductor device according to the embodiment.

Next, as shown in FIG. 2A, a second Si layer 9 is to be formed on the Si substrate 1, so as the trench is to be embedded and the Si layer 1 is to be coated thereon. The second Si layer 9 is to be formed by the epitaxial growth method (or the selective epitaxial growth method). Further, in order to remove the damage occurred to the Si substrate 1 by the dry etching process while forming the trench, surfaces of the Si substrate 1 and the Si layer 5 may be thinly oxidized, followed by the process of removing the oxide layer by the wet etching, before forming the Si layer 9. Hereinafter, a combination of the first Si layer 5 and the second Si layer 9 is to be called a Si layer 10.

Further, in order to use as an etching stopper during a CMP process which is to be performed later, a $Si_3N_4$ film may be deposited by a CVD method and the like, after oxidizing the surface of the Si layer 10.

Figure 2B:
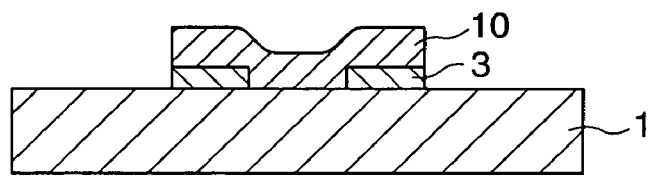

Next, as shown in FIG. 2B, by using the photolithography technology and the etching technique, the Si layer 10 and the SiGe layer 3 which are located outside of the transistor forming region are to be removed sequentially by etching (in other words, by isolating devices). Accordingly, side surfaces (end portions) of the Si layer 10 and the SiGe layer 3 are to be exposed along a periphery of the transistor forming region.

Figure 2C:
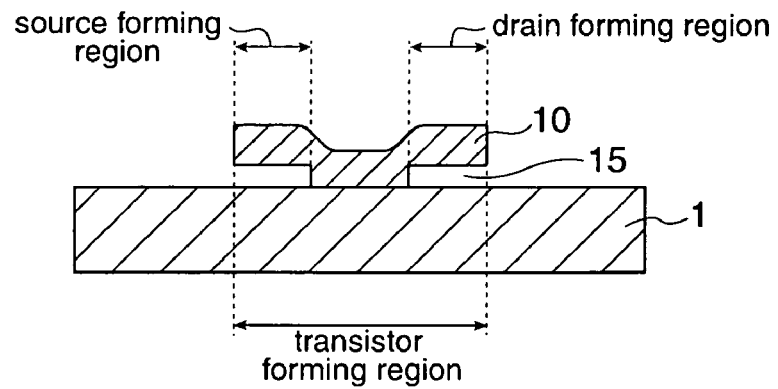

Next, as shown in FIG. 2C, by using an etching liquid such as fluoronitric acid, the etching of the SiGe layer 3 is to be performed from its exposed side surface (in other words, from the sides). In the wet etching using fluoronitric acid, an etching selectivity between SiGe and Si, for example is about 100:1, thereby enabling to selectively remove only the SiGe layer 3 without etching too much of the Si layer 10. By this selective etching, a hollow portion 15 is to be formed under the Si layer 10 in the transistor forming region. The Si layer 10 on the hollow portion 15 is the source forming region or the drain forming region.

Figure 3A:
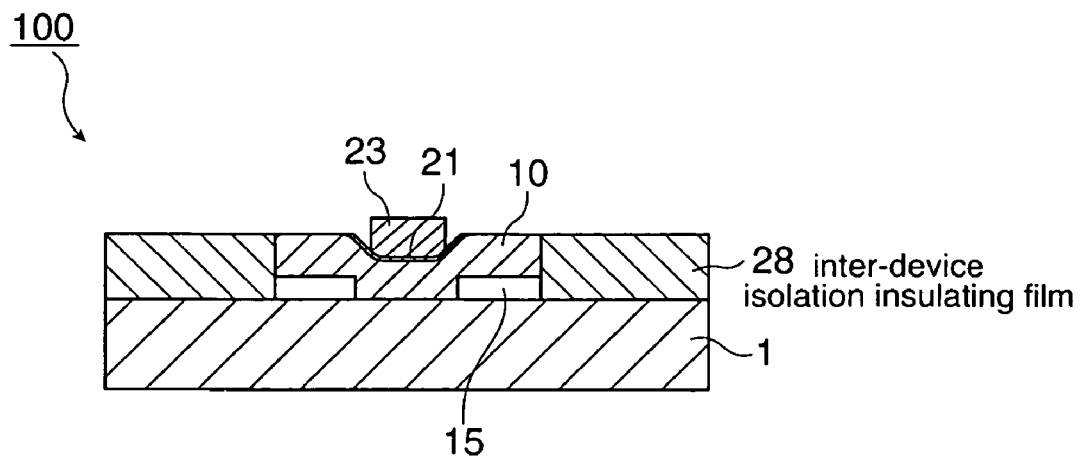
FIGS. 3A and 3B are diagrams illustrating the method for manufacturing the semiconductor device according to the embodiment.

Next, as shown in FIG. 3A, with leaving the hollow portion 15 and only blocking an aperture plane of the hollow portion 15, $SiO_2$ is to be deposited on the Si substrate 1 by the CVD method and the like, and planarize the device surface as well as isolating devices by the CMP method and the like (in other words, forming an inter-device isolation insulating film 28). At this point, in the case that a thermal oxide film is formed on the Si layer 10 and the $Si_3N_4$ film is formed on the thermal oxide film as the etching stopper for the CMP, the $Si_3N_4$ film is to be removed by phosphoric acid and the thermal oxide film is to be removed by fluorinated acid thereafter.

Next, an ion implantation for adjusting a threshold value (in other words, a channel ion implantation) is to be performed on the surface of the Si layer 10. Then, by thermal oxidizing the Si layer 10, a gate oxide film 21 is to be formed on the surface. Further, a gate electrode 23 is to be formed on the gate oxide film 21 on the channel region.

Figure 3B:
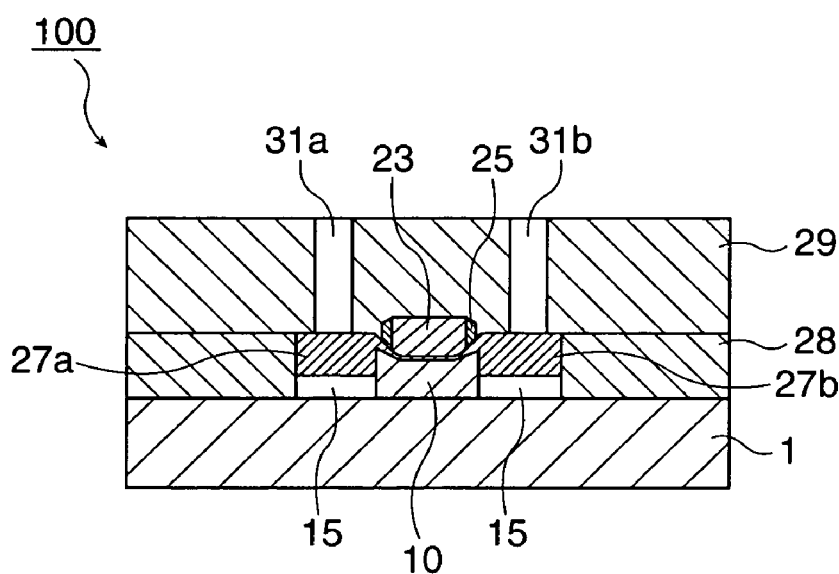

Next, as shown in FIG. 3B, after using the gate electrode 23 as a mask to perform a lightly doped drain (LDD) implantation, a sidewall 25 is to be formed at the side surface of the gate electrode 23. Then, by using the gate electrode 23 and the sidewall 25 as masks, a source layer 27a and a drain layer 27b are to be formed by ion implanting impurities, such as As, P, B and the like, to the Si layer in the source forming region and the drain forming region.

Next, as shown in FIG. 3B, an interlayer insulating film 29 is to be formed on the Si substrate 1. The interlayer insulating film, for example, is $SiO_2$, which is formed by a plasma CVD, for example. Accordingly, an SDON transistor 100 with the parasitic capacitance of the source layer 27a and the drain layer 27b reduced to the minimum is to be completed.

After completing the SDON transistor 100, the interlayer insulating film 29 on the source layer 27a and the drain layer 27b is to be removed by etching, to form contact holes 31a and 31b. Then, a plug electrode (not shown) is to be formed in the contact holes 31a and 31b, respectively, and connects the SDON transistor 100 to other devices and the like on the Si substrate 1.

Thus, according to the method for manufacturing the semiconductor device of the present embodiment, as only the source layer 27a and the drain layer 27b have an SON structure, the Si layer 10 under the gate electrode 23 can form the SDON transistor 100 which is connected to the Si substrate 1. The SDON structure, more particularly, is a structure that the hollow portion 15 exists between the source layer 27a and the Si substrate 1, and between the drain layer 27b and the Si substrate 1, respectively, and the hollow portion does not exist between the Si layer 10 under the gate electrode 23 and the Si substrate 1.

In the SDON transistor 100, the Si layer 10 under the gate electrode 23 is connected to the Si substrate 1, thereby enabling to reduce a self-heat generation effect compared to an SON transistor. Also, a potential of the Si layer 10 under the gate electrode 23 (in other words, a body potential) is to be fixed to the Si substrate 1, thereby enabling to suppress a substrate floating effect. Further, as the hollow portion 15 exists under the source layer 27a and the drain layer 27b, the parasitic capacitance of the source layer 27a and the drain layer 27b is to be reduced to the minimum.

Also, according to the method for manufacturing the semiconductor device, a structure may be formed so as a part, which the source layer 27a and the drain layer 27b of the Si layer 10 is to be formed, is only thick, and the surface is to be placed above the Si layer 10 surface under the gate electrode 23 (in other words, an elevated source/drain structure). For example, by forming the Si layer 5 thick, it is possible to selectively thicken only the Si layer 10 of the source forming region and the drain forming region. Therefore, it can prevent problems such as the plug electrode, which is not shown, reaching to the hollow portion 15 and the like.

Further, according to the method for manufacturing the semiconductor device, a hot implantation equipment such as to be used for a SIMOX method, and special manufacturing equipments such as a high temperature annealing furnace and the like are not to be used, thereby enabling to cut manufacturing cost and restrict generation of crystal defect during manufacturing.

According to the embodiment, the Si substrate 1 corresponds to a 'semiconductor substrate' of the invention, and the SiGe layer 3 corresponds to a 'first semiconductor layer' of the invention. Also, the first Si layer 5 corresponds to a 'semiconductor layer A' of the invention, the second Si layer 9 corresponds to a 'semiconductor layer B' of the invention, and the Si layer 10, which is formed by these, corresponds to a 'second semiconductor layer (or a semiconductor layer)' of the invention. Further, the trench 7 corresponds to a '(groove portion' of the invention, and the gate oxide film 21 corresponds to a 'gate insulating film' of the invention. Furthermore, the inter-device isolation insulating film 28 corresponds to a 'predetermined member' of the invention.

Furthermore, in the embodiment, as shown in FIG. 1B, a case was described in which the SiGe layer 3, the first Si layer 10 and the second Si layer 10 are to be formed on the entire surface of the Si substrate 1, respectively. However, these layers may not be formed on the entire surface of the Si substrate 1 but may only be formed in the transistor forming region and not in the region other than the transistor forming region (for example, the device isolation region). For example, the SiGe layer 3, the Si layer 10 and the like, may be formed by the selective epitaxial growth method, in a state that the surface of the Si substrate 1 in the device isolation region is coated with $SiO_2$.

Although in such a method, as in the case of the above embodiment, only the source layer 27a and the drain layer 27b have the SON structure, thereby enabling the Si layer 10 under the gate electrode 23 to form the SDON transistor 100 which is connected to the Si substrate 1.

Also, in the embodiment, the case was described in which a material for the 'semiconductor substrate' is Si, the material for the 'first semiconductor layer' is SiGe, and the material for the 'second semiconductor layer' is Si. However, these materials are not limited to the above. For example, as the material for the 'semiconductor substrate', Si, Ge, SiGe, SiC, SiSn, PbS, GaAs, InP, GaP, GaN, ZnSe and the like may be used. Further, as the material for the 'first semiconductor layer', the material which has the higher etching selectivity than the Si substrate 1 and the second semiconductor layer may be used. For example, as the materials for the 'first semiconductor layer' and the 'second semiconductor layer', a selected combination of Si, Ge, SiGe, SiC, SiSn, PbS, GaAs, InP, GaP, GaN, ZnSe and the like may be used.

The entire disclosure of Japanese Patent application No. 2005-203918, field Jul. 13, 2005 is expressly incorporated by reference herein.

What is claimed is:

1. A method for manufacturing a semiconductor device, comprising:
   (a) forming a first semiconductor layer on the semiconductor substrate in a transistor forming region;
   (b) forming a groove portion in the first semiconductor layer so as to expose a surface of the semiconductor substrate by etching and removing a portion sandwiched between a source forming region and a drain forming region of the first semiconductor layer;
   (c) forming a second semiconductor layer having a smaller etching selectivity than the first semiconductor layer on the semiconductor substrate in the transistor forming region, so as an inside of the groove portion being embedded and the first semiconductor layer being coated thereon;
   (d) forming a hollow portion under the second semiconductor layer by etching and removing the first semiconductor layer under the second semiconductor layer from an outside of the transistor forming region; and
   (e) blocking an aperture plane of the hollow portion with a predetermined member, leaving the hollow portion under the second semiconductor layer.

2. A method for manufacturing a semiconductor device, comprising:
   (a) forming the first semiconductor layer on the semiconductor substrate;
   (b) forming the groove portion in the first semiconductor layer so as to expose the surface of the semiconductor substrate by etching and removing the portion sandwiched between the source forming region and the drain forming region of the first semiconductor layer;
   (c) forming the second semiconductor layer having the smaller etching selectivity than the first semiconductor layer on the semiconductor substrate so as the inside of the groove portion being embedded and the first semiconductor layer being coated thereon;
   (d) exposing an end of the first semiconductor layer along a periphery of the transistor forming region, by sequentially etching and removing the second semiconductor layer and the first semiconductor layer outside of the transistor forming region;
   (e) forming a hollow portion under the second semiconductor layer in the transistor forming region by etching and removing the first semiconductor layer from the exposed end; and
   (f) blocking the aperture plane of the hollow portion with the predetermined member, leaving the hollow portion under the second semiconductor layer.

3. A method for manufacturing a semiconductor device, comprising:
   (a) forming the first semiconductor layer on the semiconductor substrate;

(b) forming a semiconductor layer A having the smaller etching selectivity than the first semiconductor layer on the first semiconductor layer;

(c) forming the groove portion in a laminated body so as to expose the surface of the semiconductor substrate by etching and removing the portion sandwiched between the source forming region and the drain forming region of the laminated body configured with the first semiconductor layer and the semiconductor layer A;

(d) forming a semiconductor layer B being made of the same material as the semiconductor layer A on the semiconductor substrate so as the inside of the groove portion being embedded and the first semiconductor layer being coated thereon;

(e) exposing the end of the first semiconductor layer along the periphery of the transistor forming region by sequentially etching and removing the portion and the first semiconductor layer outside of the transistor forming region of the second semiconductor layer configured with the semiconductor layer A and the semiconductor layer B;

(f) forming a hollow portion under the second semiconductor layer in the transistor forming region by etching and removing the first semiconductor layer from the exposed end; and (g) blocking the aperture plane of the hollow portion with the predetermined member, leaving the hollow portion under the second semiconductor layer.

4. The method for manufacturing the semiconductor device according to claim 1, between the step (d) of forming the hollow portion under the second semiconductor layer in the transistor forming region and the step (e) of blocking the aperture plane of the hollow portion, further comprising:

(a') forming the gate electrode on the second semiconductor layer sandwiched between the source forming region and the drain forming region via the gate insulating film; and (b') forming the source layer on the second semiconductor layer in the source forming region, and forming the drain layer on the second semiconductor layer in the drain forming region.

5. The method for manufacturing the semiconductor device according to claim 4, wherein the predetermined member is an inter-device isolation insulating film; and the step of blocking the aperture plane of the hollow portion includes to form the inter-device isolation insulating film over the entire surface of the semiconductor substrate so as to block the aperture plane of the hollow portion, and leave the hollow portion under the second semiconductor layer.

* * * * *